(12) United States Patent
Hara et al.

(10) Patent No.: US 9,087,749 B2
(45) Date of Patent: Jul. 21, 2015

(54) ACTIVE MATRIX SUBSTRATE, AND DISPLAY PANEL

(75) Inventors: Takeshi Hara, Osaka (JP); Hirohiko Nishiki, Osaka (JP); Hisao Ochi, Osaka (JP); Tetsuya Aita, Osaka (JP); Tohru Okabe, Osaka (JP); Yuya Nakano, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 13/976,056

(22) PCT Filed: Dec. 20, 2011

(86) PCT No.: PCT/JP2011/007096
§ 371 (c)(1),
(2), (4) Date: Oct. 3, 2013

(87) PCT Pub. No.: WO2012/090432
PCT Pub. Date: Jul. 5, 2012

(65) Prior Publication Data
US 2014/0014950 A1    Jan. 16, 2014

(30) Foreign Application Priority Data
Dec. 27, 2010    (JP) .................................. 2010-289656

(51) Int. Cl.
*H01L 29/12*    (2006.01)
*H01L 27/12*    (2006.01)
*H01L 29/49*    (2006.01)
(Continued)

(52) U.S. Cl.
CPC .......... *H01L 27/1248* (2013.01); *G02F 1/1368* (2013.01); *G02F 1/136286* (2013.01); *H01L 27/124* (2013.01); *H01L 27/1296* (2013.01); *H01L 29/4908* (2013.01); *H01L 29/78696* (2013.01); *G02F 2001/13629* (2013.01); *H01L 29/458* (2013.01)

(58) Field of Classification Search
CPC ..... H01L 29/12; H01L 29/7869; H01L 21/16; H01L 21/379; H01L 29/24; H01L 27/1248
USPC .................................. 257/43; 438/104; 349/46
See application file for complete search history.

(56) References Cited

U.S. PATENT DOCUMENTS 6,277,751 B1 * 8/2001 Niu et al. ...................... 438/692
2002/0135710 A1   9/2002 Chae
(Continued)

FOREIGN PATENT DOCUMENTS

JP    2003-005220 A    1/2003
JP    2006-258965 A    9/2006
(Continued)

OTHER PUBLICATIONS

Official Communication issued in International Patent Application No. PCT/JP2011/007096, mailed on Mar. 27, 2012.

*Primary Examiner* — Phuc Dang
(74) *Attorney, Agent, or Firm* — Keating & Bennett, LLP

(57) ABSTRACT

An active matrix substrate (20a) includes a gate electrode (25) formed on an insulating substrate (10a), and a planarizing film (26) formed on the gate electrode (25) and made of a baked SOG material. The gate electrode (25) is a multilayer film including a first conductive film (27) formed on the insulating substrate (10a) and made of a metal except copper, a second conductive film (28) formed on the first conductive film (27) and made of copper, and a third conductive film (29) formed on the second conductive film (28) and made of the metal except copper.

12 Claims, 9 Drawing Sheets

(51) Int. Cl.
*H01L 29/786* (2006.01)
*G02F 1/1362* (2006.01)
*G02F 1/1368* (2006.01)
*H01L 29/45* (2006.01)

(56) References Cited

U.S. PATENT DOCUMENTS

2006/0209222 A1  9/2006  Yasuda et al.
2009/0184315 A1* 7/2009  Lee et al. .................. 257/43
2010/0295037 A1  11/2010 Hironaka
2011/0133193 A1* 6/2011  Song et al. ................ 257/59
2011/0240987 A1* 10/2011 Lee et al. .................. 257/43
2013/0146862 A1* 6/2013  Kim et al. ................. 257/43

FOREIGN PATENT DOCUMENTS

JP    2007-225860 A    9/2007
JP    2010-272663 A    12/2010
KR   10-2008-0010957 A  1/2008

* cited by examiner

ACTIVE MATRIX SUBSTRATE, AND DISPLAY PANEL

TECHNICAL FIELD

The present disclosure relates to active matrix substrates, and methods for manufacturing the same, and more particularly to an active matrix substrate using a planarizing film, a method for manufacturing the same, and a display panel.

BACKGROUND ART

An active matrix substrate includes, e.g., thin film transistors (hereinafter also referred to as "TFTs") as switching elements, one for each pixel, which is the smallest unit of an image.

In order to improve the reliability of an active matrix substrate, TFTs, interconnects, and other components need to be accurately formed on a substrate. For such an active matrix substrate, e.g., patterns of electrodes and interconnects are formed on an insulative substrate to form an uneven surface, and a planarizing film that is an insulating film is formed to cover and planarize the uneven surface. The planarizing film is typically made of, e.g., a spin-on glass (SOG) material, $SiO_2$ in liquid form, or a polymeric film.

Typically, an active matrix substrate includes a gate electrode, a source electrode, and a drain electrode forming portions of a TFT described above, and in order to prevent the electrodes from being excessively etched in an etching step in a manufacturing process, the electrodes are multilayer films each including a plurality of conductive films. For example, a titanium film is formed as a first conductive film that is a lower film of the gate electrode, and a copper film is formed as a second conductive film that is an upper film of the gate electrode. Then, a planarizing film described above is formed on the surface of the gate electrode (see, e.g., PATENT DOCUMENT 1).

CITATION LIST

Patent Document

PATENT DOCUMENT 1: Japanese Patent Publication No. 2003-5220

SUMMARY OF THE INVENTION

Technical Problem

Here, when an SOG material having, e.g., silanol $(Si(OH)_4)$ as the main ingredient is applied to the entire surface of a substrate on which gate electrodes have been formed, and is then baked at high temperature (e.g., 350° C.) to form a planarizing film, the SOG material undergoes a dehydration polymerization reaction to produce moisture, which causes oxidization of a copper film forming portions of gate lines. The baking causes copper to diffuse from the copper film into the SOG material. Consequently, the resistance of a multilayer film including the copper film and a titanium film increases, and the dielectric constant of the SOG material increases, thereby deteriorating insulation performance.

It is therefore an object of the present disclosure to provide an active matrix substrate that can prevent oxidation of a copper film during the formation of a planarizing film on the surface of the copper film, and prevent diffusion of copper, a method for manufacturing the same, and a display panel.

Solution to the Problem

In order to achieve the object, an active matrix substrate of the present disclosure includes: an insulating substrate; a gate electrode formed on the insulating substrate; a planarizing film formed on the gate electrode, and made of a baked SOG material; a gate insulating layer covering the gate electrode and the planarizing film; a semiconductor layer formed on the gate insulating layer, and having a channel region overlapping the gate electrode; source and drain electrodes formed on the semiconductor layer to overlap the gate electrode and face each other with the channel region sandwiched therebetween; a protection layer covering the semiconductor layer, the source and drain electrodes; and a pixel electrode formed on the protection layer. The gate electrode is a multilayer film including a first conductive film formed on the insulating substrate and made of a metal except copper, a second conductive film formed on the first conductive film and made of copper, and a third conductive film formed on the second conductive film and made of the metal except copper.

With the configuration, even when an SOG material is applied to the entire surface of the substrate on which the gate electrode has been formed, and is baked to form the planarizing film, and during this formation, the SOG material undergoes a dehydration polymerization reaction to produce moisture, the moisture can be prevented from causing oxidation of copper forming a portion of the gate electrode. Furthermore, copper can be prevented from diffusing from the second conductive film into the SOG material due to the baking. Therefore, an increase in the resistance of the gate electrode can be reduced, and an increase in the dielectric constant of the SOG material can be reduced, thereby preventing a deterioration in the insulation performance of the planarizing film.

In the active matrix substrate of the present disclosure, the metal except copper may be at least one selected from a group consisting of titanium (Ti), molybdenum nitride (MoN), titanium nitride (TiN), tungsten (W), a molybdenum-titanium alloy (MoTi), and a molybdenum-tungsten alloy (MoW).

With the configuration, a highly non-diffusive material that can be etched by wet etching at the same time as copper can form the first and third conductive films.

In the active matrix substrate of the present disclosure, an interlayer insulating layer may be formed on the protection layer, and the pixel electrode may be formed on the interlayer insulating layer.

In the active matrix substrate of the present disclosure, the semiconductor layer may be an oxide semiconductor layer.

In the active matrix substrate of the present disclosure, the oxide semiconductor layer may be made of a metal oxide containing at least one selected from a group consisting of indium (In), gallium (Ga), aluminum (Al), copper (Cu), and zinc (Zn).

With the configuration, the oxide semiconductor layer made of the material can have a high mobility even if the oxide semiconductor layer is amorphous, and therefore, can provide a large on-resistance of the switching element.

In the active matrix substrate of the present disclosure, the oxide semiconductor layer may be made of indium gallium zinc oxide (IGZO).

With the configuration, the thin film transistor can provide satisfactory performance, i.e., high mobility and low off-current.

In the active matrix substrate of the present disclosure, the semiconductor layer may be a silicon semiconductor layer.

The active matrix substrate of the present disclosure exhibits excellent performance, where an increase in the resistance of the gate electrode can be reduced, and an increase in the dielectric constant of the SOG material can be reduced, thereby preventing a deterioration in the insulation performance of the planarizing film. Therefore, the active matrix substrate of the present disclosure can be suitably used for a display panel including an active matrix substrate, a counter substrate placed so as to be opposed to the active matrix substrate, and a display medium layer formed between the active matrix substrate and the counter substrate.

A method for manufacturing an active matrix substrate according to the present disclosure is directed to a method for manufacturing an active matrix substrate including an insulating substrate, a gate electrode formed on the insulating substrate, a planarizing film formed on the gate electrode, a gate insulating layer covering the gate electrode and the planarizing film, a semiconductor layer formed on the gate insulating layer, and having a channel region overlapping the gate electrode, source and drain electrodes formed on the semiconductor layer to overlap the gate electrode and face each other with the channel region sandwiched therebetween, a protection layer covering the semiconductor layer, and the source and drain electrodes, and a pixel electrode formed on the protection layer. The method includes at least: a gate electrode formation step of forming the gate electrode that is a multilayer film including a first conductive film formed on the insulating substrate and made of a metal except copper, a second conductive film formed on the first conductive film and made of copper, and a third conductive film formed on the second conductive film and made of the metal except copper; a planarizing film formation step of applying an SOG material onto the insulating substrate on which the gate electrode has been formed, and baking the SOG material to form the planarizing film covering the insulating substrate and the gate electrode; a gate insulating layer formation step of forming the gate insulating layer to cover the gate electrode and the planarizing film; a semiconductor layer formation step of forming the semiconductor layer on the gate insulating layer; a source/drain formation step of forming the source and drain electrodes on the semiconductor layer; a protection layer formation step of forming the protection layer covering the semiconductor layer, and the source and drain electrodes; and a pixel electrode formation step of forming the pixel electrode on the protection layer.

With the configuration, even when an SOG material is applied to the entire surface of the substrate on which the gate electrode has been formed, and is baked to form the planarizing film, and during this formation, the SOG material undergoes a dehydration polymerization reaction to produce moisture, the moisture can be prevented from causing oxidation of copper forming a portion of the gate electrode. Furthermore, copper can be prevented from diffusing from the second conductive film into the SOG material due to the baking. Therefore, an increase in the resistance of the gate electrode can be reduced, and an increase in the dielectric constant of the SOG material can be reduced, thereby preventing a deterioration in insulation performance of the planarizing film.

In the method of the present disclosure, in the planarizing film formation step, the third conductive film may be removed.

The configuration eliminates the need for leaving the third conductive film, thereby eliminating the need for forming the thicker third conductive film. This can reduce a reduction in productivity, and can prevent an increase in cost.

Furthermore, since the thicker third conductive film that is an upper layer of the gate electrode does not need to be formed, this can prevent a problem of poor application of the SOG material.

In the method of the present disclosure, at least one selected from a group consisting of titanium (Ti), molybdenum nitride (MoN), titanium nitride (TiN), tungsten (W), a molybdenum-titanium alloy (MoTi), and a molybdenum-tungsten alloy (MoW) may be used as the metal except copper.

With the configuration, a highly non-diffusive material that can be etched by wet etching at the same time as copper can form the first and third conductive films.

Advantages of the Invention

According to the present disclosure, an increase in the resistance of the gate electrode can be reduced, and an increase in the dielectric constant of the SOG material can be reduced, thereby preventing a deterioration in the insulation performance of the planarizing film.

DESCRIPTION OF EMBODIMENTS

Embodiments of the present disclosure will be described hereinafter in detail with reference to the drawings. The present disclosure is not limited to the following embodiments.

First Embodiment

Figure 1:
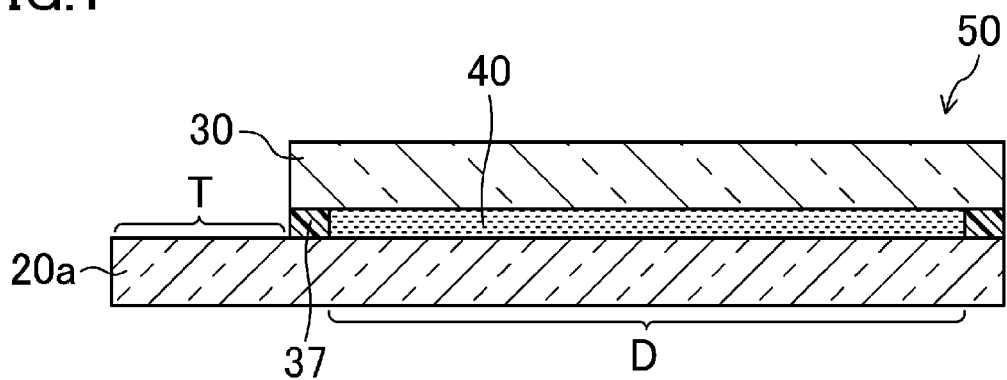
FIG. 1 is a cross-sectional view of a liquid crystal display panel including an active matrix substrate according to a first embodiment of the present disclosure.
Figure 2:
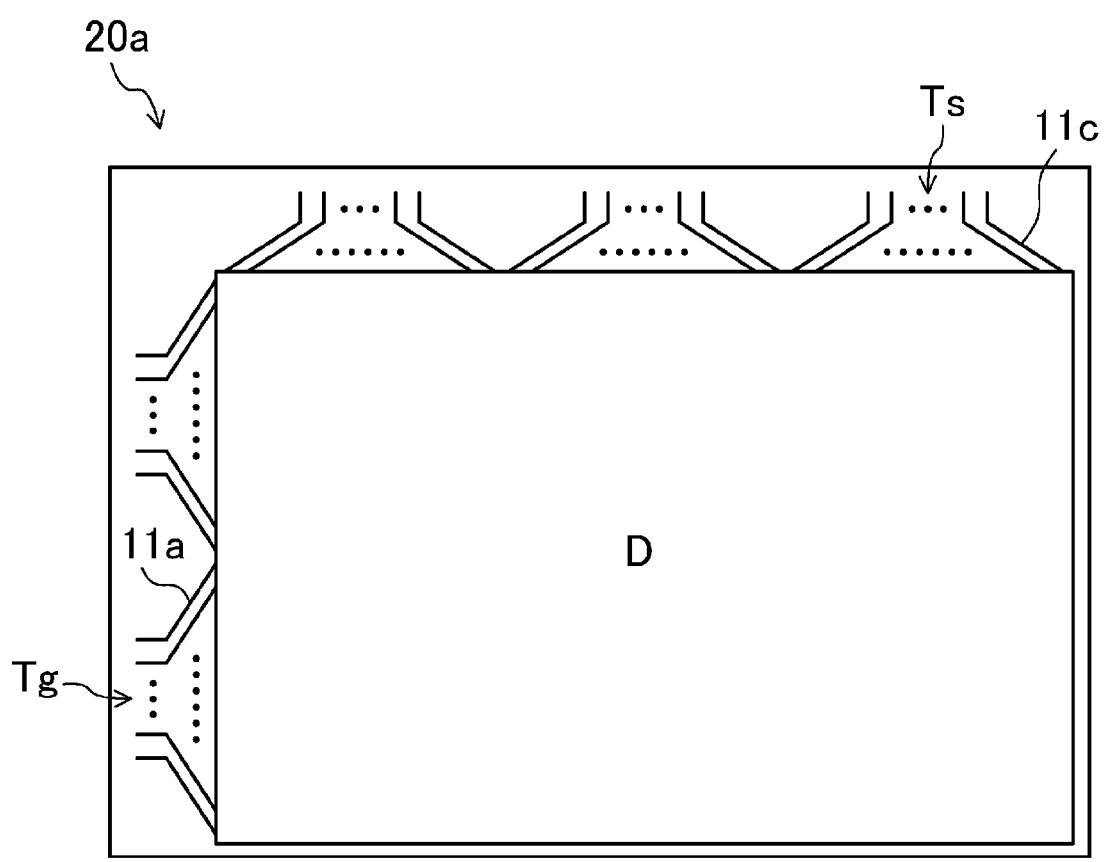
FIG. 2 is a plan view of the active matrix substrate according to the first embodiment of the present disclosure.
Figure 3:
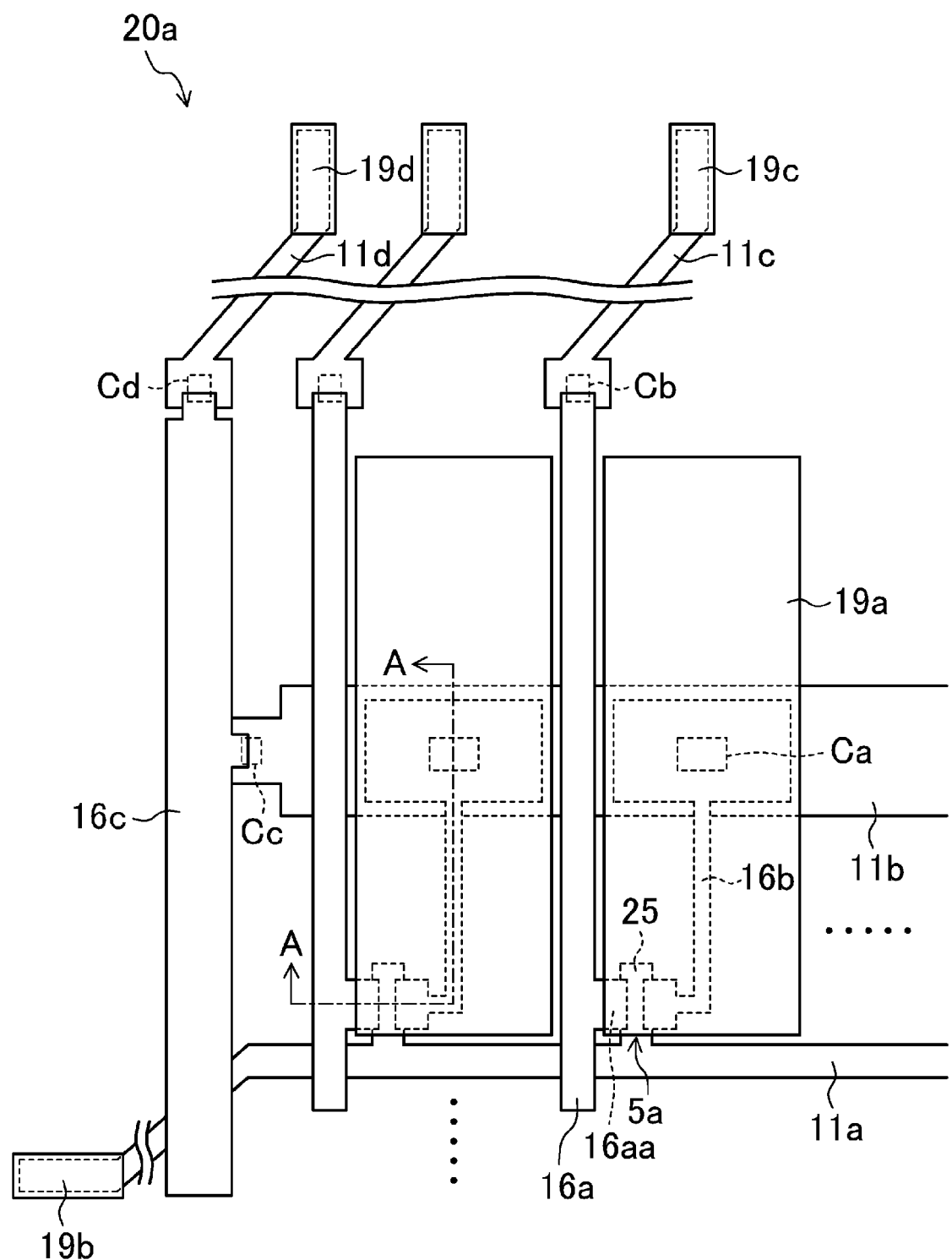
FIG. 3 is an enlarged plan view of a pixel portion and a terminal portion of the active matrix substrate according to the first embodiment of the present disclosure.

FIG. 1 is a cross-sectional view of a liquid crystal display panel including an active matrix substrate according to a first embodiment of the present disclosure, and FIG. 2 is a plan view of the active matrix substrate according to the first embodiment of the present disclosure. FIG. 3 is an enlarged plan view of a pixel portion and a terminal portion of the active matrix substrate according to the first embodiment of the present disclosure, and FIG. 4 is a cross-sectional view taken along the line A-A in FIG. 3.

As illustrated in FIG. 1, a liquid crystal display panel 50 includes an active matrix substrate 20a, a counter substrate 30 placed so as to be opposed to the active matrix substrate 20a, and a liquid crystal layer 40 formed between the active matrix substrate 20a and the counter substrate 30. Furthermore, the liquid crystal display panel 50 includes a frame-shaped sealant 37 that is used to bond the active matrix substrate 20a and the counter substrate 30 together and enclose the liquid crystal layer 40 between the active matrix substrate 20a and the counter substrate 30.

Furthermore, as illustrated in FIG. 1, in the liquid crystal display panel 50, a display region D for displaying an image is defined inside the sealant 37, and a terminal region T is defined to correspond to a portion of the active matrix substrate 20a projecting beyond the counter substrate 30.

Figure 4:
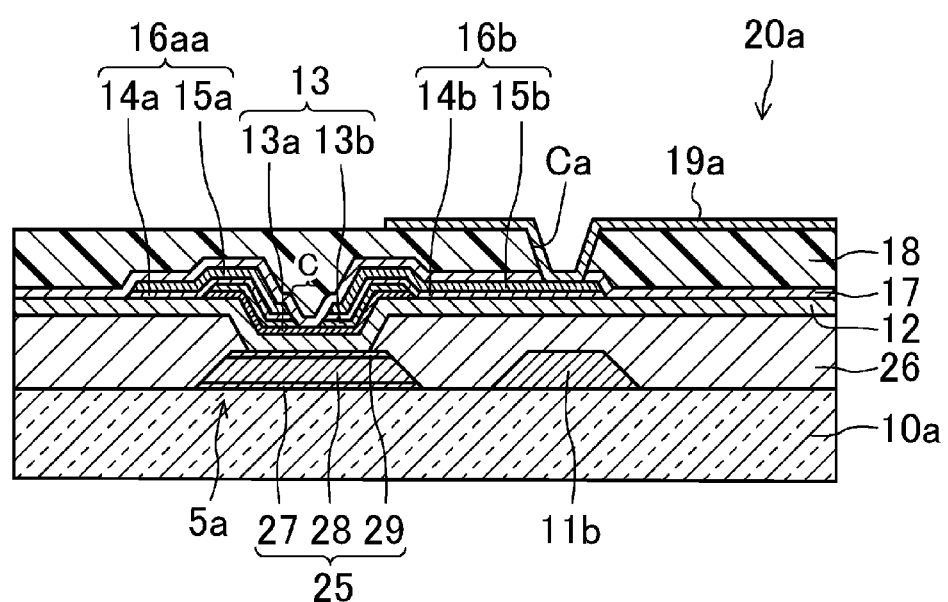
FIG. 4 is a cross-sectional view taken along the line A-A in FIG. 3.

As illustrated in FIGS. 2, 3, and 4, the active matrix substrate 20a includes an insulating substrate 10a, a plurality of scan lines 11a formed on the insulating substrate 10a to extend in parallel to each other in the display region D, and a plurality of auxiliary capacitor lines 11b each formed between corresponding ones of the scan lines 11a to extend in parallel to each other in the display region D. The active matrix substrate 20a further includes a plurality of signal lines 16a extending in a direction orthogonal to the scan lines 11a and in parallel to each other, and a plurality of TFTs 5a each provided at a corresponding one of the intersections of the scan lines 11a and the signal lines 16a, i.e., for each pixel. The active matrix substrate 20a further includes a protection layer 17 covering the TFTs 5a, an interlayer insulating film 18 covering the protection layer 17, a plurality of pixel electrodes 19a arranged in a matrix on the interlayer insulating layer 18 and connected to the corresponding TFTs 5a, and an alignment film (not shown) covering the pixel electrodes 19a.

As illustrated in FIGS. 2 and 3, each of the scan lines 11a is extended into a gate terminal region Tg of the terminal region T (see FIG. 1), and is connected to a gate terminal 19b in the gate terminal region Tg.

As illustrated in FIG. 3, each of the auxiliary capacitor lines 11b is connected via an auxiliary capacitor main line 16c and a relay line 11d to an auxiliary capacitor terminal 19d. Here, the auxiliary capacitor main line 16c is connected to the auxiliary capacitor line 11b via a contact hole Cc formed in a gate insulating layer 12, and to the relay line 11d via a contact hole Cd formed in the gate insulating layer 12.

As illustrated in FIGS. 2 and 3, each of the signal lines 16a is extended as a relay line 11c into a source terminal region Ts of the terminal region T (see FIG. 1), and is connected to a source terminal 19c in the source terminal region Ts. Furthermore, as illustrated in FIG. 3, the signal line 16a is connected to the relay line 11c via a contact hole Cb formed in the gate insulating layer 12.

As illustrated in FIGS. 3 and 4, the TFTs 5a each include a gate electrode 25 formed on the insulating substrate 10a, a planarizing film 26 formed on the gate electrode 25 and made of a spin-on glass material, the gate insulating layer 12 covering the gate electrode 25 and the planarizing film 26, a semiconductor layer 13 having an island-like channel region C that is formed on the gate insulating layer 12 to overlap the gate electrode 25, a source electrode 16aa and a drain electrode 16b formed on the semiconductor layer 13 to overlap the gate electrode 25 and face each other with the channel region C sandwiched therebetween.

Here, as illustrated in FIG. 3, the gate electrode 25 is a laterally protruding portion of a corresponding one of the scan lines 11a. As illustrated in FIG. 3, the source electrode 16aa is a laterally protruding portion of a corresponding one of the signal lines 16a. As illustrated in FIG. 4, the source electrode 16aa is a multilayer film of a first conductive layer 14a and a second conductive layer 15a. Furthermore, as illustrated in FIGS. 3 and 4, the drain electrode 16b is a multilayer film of a first conductive layer 14b and a second conductive layer 15b, is connected to a corresponding one of the pixel electrodes 19a via a contact hole Ca formed in a multilayer film including the interlayer insulating layer 17 and the interlayer insulating layer 18, and is formed over the auxiliary capacitor line 11b with the gate insulating layer 12 sandwiched therebetween, thereby forming an auxiliary capacitor.

The semiconductor layer 13 includes silicon layers, and includes, e.g., an intrinsic amorphous silicon layer 13a that is a lower layer, and an n$^+$ amorphous silicon layer (electrode contact layer) 13b that is doped with n-type impurities (e.g., phosphorus) and is an upper layer.

Figure 6A:
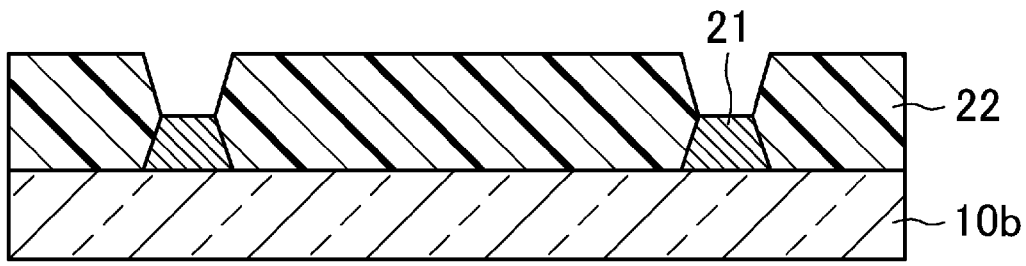
FIGS. 6(a)-6(c) are cross-sectional views illustrating process steps for manufacturing a counter substrate according to the first embodiment of the present disclosure.
Figure 6B:
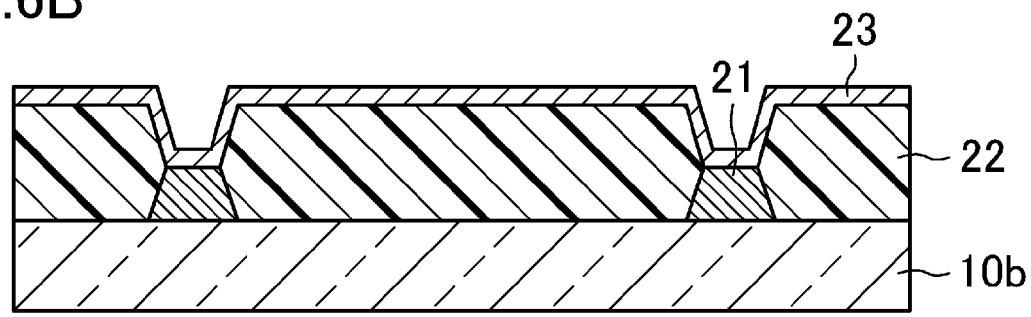
Figure 6C:
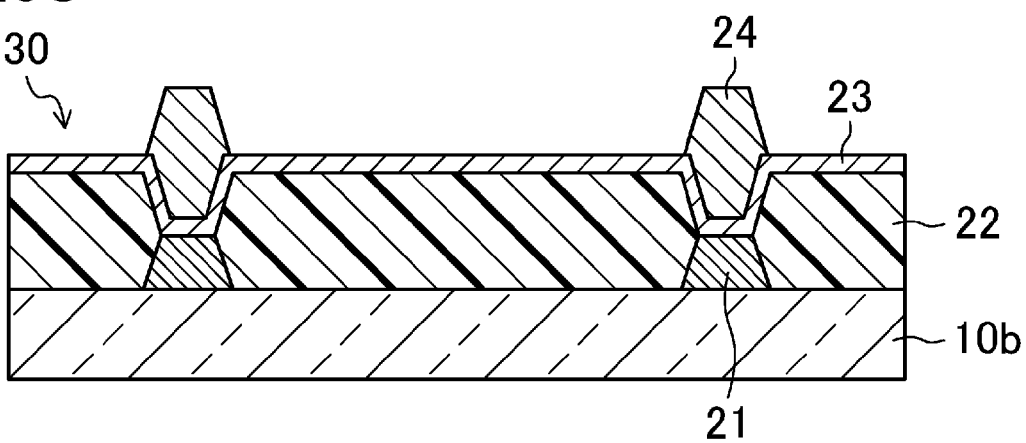

As illustrated in FIG. 6(c) described below, the counter substrate 30 includes an insulating substrate 10b, a black matrix 21 with a grid pattern formed on the insulating substrate 10b, and a color filter layer including color layers 22, such as a red layer, a green layer, and a blue layer, that are each formed between grid bars of the black matrix 21. The counter substrate 30 further includes a common electrode 23 covering the color filter layer, a photospacer 24 formed on the common electrode 23, and an alignment film (not shown) covering the common electrode 23.

The liquid crystal layer 40 is made of, e.g., a nematic liquid crystal material having electro-optic properties.

In the liquid crystal display panel 50 thus configured, in each pixel, when a gate signal is sent from a gate driver (not shown) through the scan line 11a to the gate electrode 25, and the TFT 5a is turned on, a source signal is sent from a source driver (not shown) through the signal line 16a to the source electrode 16aa, and predetermined charge is written through the semiconductor layer 13 and the drain electrode 16b to the pixel electrode 19a. In this case, a potential difference occurs between each pixel electrode 19a of the active matrix substrate 20a and the common electrode 23 of the counter substrate 30, and therefore, a predetermined voltage is applied to the liquid crystal layer 40, i.e., the liquid crystal capacitor of each pixel, and the auxiliary capacitor connected in parallel to the liquid crystal capacitor. In the liquid crystal display panel 50, in each pixel, the alignment of the liquid crystal layer 40 is changed, depending on the magnitude of the voltage applied to the liquid crystal layer 40, to adjust the light transmittance of the liquid crystal layer 40, thereby displaying an image.

Here, features of this embodiment are that as illustrated in FIG. 4, the gate electrode 25 is formed on the insulating substrate 10a, and is a multilayer film including a first conductive film 27 made of a metal except copper (e.g., titanium), a second conductive film 28 formed on the first conductive film 27 and made of copper, and a third conductive film 29 formed on the second conductive film 28 and made of the metal except copper (e.g., titanium).

In this embodiment, the third conductive film 29 made of the metal except copper is formed on the second conductive film 28 made of copper; therefore, even when an SOG material having, e.g., silanol $(Si(OH)_4)$ as the main ingredient is applied to the entire surface of the substrate on which the gate electrode 25 has been formed, is then baked at high temperature (e.g., 350° C.) to form a planarizing film, and during this formation, the SOG material undergoes a dehydration polymerization reaction to produce moisture, the moisture can be prevented from causing oxidation of copper forming a portion of the gate electrode 25. Furthermore, copper can be prevented from diffusing from the second conductive film 28 into the SOG material due to the baking.

Therefore, an increase in the resistance of the gate electrode 25 can be reduced, and an increase in the dielectric constant of the SOG material can be reduced, thereby preventing a deterioration in the insulation performance of the planarizing film 26.

A non-diffusive metal that can be etched at the same time as copper forming the second conductive film 28 is suitably used as the metal forming the first and third conductive films 27 and 29, and examples of the metal include titanium (Ti), molybdenum nitride (MoN), titanium nitride (TiN), tungsten (W), a molybdenum-titanium alloy (MoTi), and a molybdenum-tungsten alloy (MoW).

Next, an example method for manufacturing a liquid crystal display panel 50 according to this embodiment will be described with reference to FIGS. 5(*a*)-6(*c*). FIGS. 5(*a*)-5(*e*) are cross-sectional views illustrating process steps for manufacturing an active matrix substrate according to the first embodiment of the present disclosure. FIGS. 6(*a*)-6(*c*) are cross-sectional views illustrating process steps for manufacturing a counter substrate according to the first embodiment of the present disclosure. The manufacturing method of this embodiment includes an active matrix substrate formation step, a counter substrate formation step, and a liquid crystal injection step.

First, a process for forming a TFT and an active matrix substrate will be described.

<Gate Electrode Formation Step>

Initially, for example, a titanium film (thickness: 5-100 nm) for a first conductive film 27, a copper film (thickness: 100-500 nm) for a second conductive film 28, and a titanium film (thickness: 5-200 nm) for a third conductive film 29 are sequentially deposited by sputtering on the entire surface of an insulating substrate 10*a*, such as a glass substrate. Thereafter, patterning of a resist by photolithography with a first photomask having a predetermined pattern, wet etching of the films, removal of the resist, and irrigation are performed to form gate electrodes 25 that are each a multilayer film including the first through third conductive films 27-29 as illustrated in FIG. 5(*a*). Scan lines 11*a*, auxiliary capacitor lines 11*b*, and relay lines 11*c* and 11*d* all illustrated in FIG. 3 are formed at the same time as the gate electrodes 25.

<Planarizing Film Formation Step>

Next, an SOG material having, e.g., silanol (Si(OH)$_4$) as the main ingredient is applied, by spin coating or slit coating, onto the insulating substrate 10*a* on which the gate electrodes 25, the scan lines 11*a*, the auxiliary capacitor lines 11*b*, and the relay lines 11*c* and 11*d* have been formed. Thereafter, the SOG material is baked at 350° C. to form a silicon dioxide (SiO$_2$) layer. Next, patterning of a resist by photolithography with a second photomask having a predetermined pattern, dry etching of the silicon dioxide layer, removal of the resist, and irrigation are performed to form a planarizing film 26 (thickness: 100-3000 nm) on the insulating substrate 10*a* and the gate electrodes 25 as illustrated in FIG. 5(*b*).

An SOG material having alkoxysilane or an organosiloxane resin as the main ingredient c an be also used as the SOG material.

In this case, even when the SOG material undergoes a dehydration polymerization reaction due to baking to produce moisture, the moisture can be prevented from causing oxidation of copper forming portions of the gate electrodes 25, because the third conductive film 29 is formed on the second conductive film 28 as described above. Furthermore, copper can be prevented from diffusing from the second conductive film 28 into the SOG material due to the baking.

The wet etching in the above-described gate electrode formation step may cause the first and third conductive films 27 and 29 made of titanium to protrude beyond the second conductive film 28 made of copper, (or cause the gate electrodes 25 to form a reversely tapered shape), because the etch rate of copper is higher than that of titanium. However, since the SOG material is applied onto the insulating substrate 10*a* and planarized to form the planarizing film 26, this can prevent portions of signal lines 16*a* over the gate electrodes 25 from being broken.

<Gate Insulating Layer Formation Step>

Next, a silicon nitride film (thickness: about 200-500 nm), for example, is deposited by CVD over the entire surface of the substrate on which the planarizing film 26 has been formed, thereby forming a gate insulating layer 12 to cover the gate electrodes 25, the auxiliary capacitor lines 11*b*, and the planarizing film 26.

The gate insulating layer 12 may be made of a stack of two layers. In this case, in addition to the silicon nitride film (SiN$_x$), a silicon oxide film (SiO$_x$), a silicon oxynitride film (SiO$_x$N$_y$, x>y), or a silicon nitride oxide film (SiN$_x$O$_y$, x>y), for example, may be used.

To prevent diffusion of, for example, an impurity from the insulating substrate 10*a*, a silicon nitride film or a silicon nitride oxide film is preferably used as a lower gate insulating layer, whereas a silicon oxide film or a silicon oxynitride film is preferably used as an upper gate insulating layer. For example, a silicon nitride film with a thickness of 100-200 nm can be formed as a lower gate insulating layer using SiH$_4$ and NH$_3$ as a reactant gas, and a silicon oxide film with a thickness of 50-100 nm can be formed as an upper gate insulating layer using N$_2$O and SiH$_4$ as a reactant gas.

To deposit a dense gate insulating layer 12 with a small gate leakage current at a low temperature, a rare gas, such as an argon gas, is preferably contained in the reactant gas so as to be mixed in the insulating layer.

<Semiconductor Layer Formation Step>

Subsequently, for example, an intrinsic amorphous silicon film (thickness: 30-300 nm) and an n$^+$ amorphous silicon film (thickness: 50-150 nm) doped with phosphorus are successively deposited by plasma CVD over the entire surface of the substrate on which the gate insulating layer 12 has been formed to form a semiconductor layer 13 obtained by stacking the intrinsic amorphous silicon layer 13*a* and the n$^+$ amorphous silicon layer 13*b* as illustrated in FIG. 5(*c*). In this case, patterning of a resist by photolithography with a third photomask having a predetermined pattern, dry etching of the silicon films, removal of the resist, and irrigation are performed to pattern the silicon films into the semiconductor layer 13.

<Source/Drain Formation Step>

Next, for example, a titanium film (thickness: 5-100 nm), a copper film (thickness: 100-500 nm), and other films are sequentially deposited by sputtering over the entire surface of the substrate on which the semiconductor layer 13 has been formed. Thereafter, patterning of a resist by photolithography with a fourth photomask having a predetermined pattern, and wet etching of the copper film are performed, and dry etching (plasma etching) of the titanium film and the n$^+$ amorphous silicon layer 13*b*, removal of the resist, and irrigation are performed. As a result, as illustrated in FIG. 5(*d*), signal lines 16*a* (see FIG. 3), source electrodes 16*aa*, drain electrodes 16b, and auxiliary capacitor main lines 16c (see FIG. 3) are formed with channel regions C of the semiconductor layer 13 being exposed.

In this embodiment, the titanium film and the copper film forming the stack have been illustrated as the metal films forming the source electrodes 16aa and the drain electrodes 16b. Alternatively, for example, a metal film, such as an aluminum film, a tungsten film, a tantalum film, or a chromium film, a film of an alloy containing at least one of these elements, or a film of a metal nitride may form the source electrodes 16aa and the drain electrodes 16b.

A light-transmissive material, such as an indium tin oxide (ITO), indium zinc oxide (IZO), indium tin oxide (ITSO) containing silicon oxide, diindium trioxide ($In_2O_3$), tin dioxide ($SnO_2$), zinc oxide (ZnO), titanium nitride (TiN), may be used as the conductive material.

Either the above-described dry etching or wet etching may be used as the etching process. However, when a large-area substrate is treated, dry etching is preferably used. A fluorine-based gas, such as $CF_4$, $NF_3$, $SF_6$, or $CHF_3$, a chlorine-based gas, such as $Cl_2$, $BCl_3$, $SiCl_4$, or $CCl_4$, or an oxygen gas, for example, can be used as the etching gas, and an inert gas, such as helium or argon, may be added to the etching gas.

<Protection Layer Formation Step>

Figure 5A:
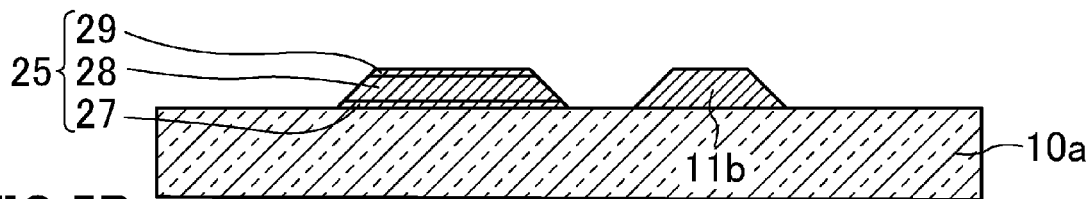
FIGS. 5(a)-5(e) are cross-sectional views illustrating process steps for manufacturing an active matrix substrate according to the first embodiment of the present disclosure.
Figure 5B:
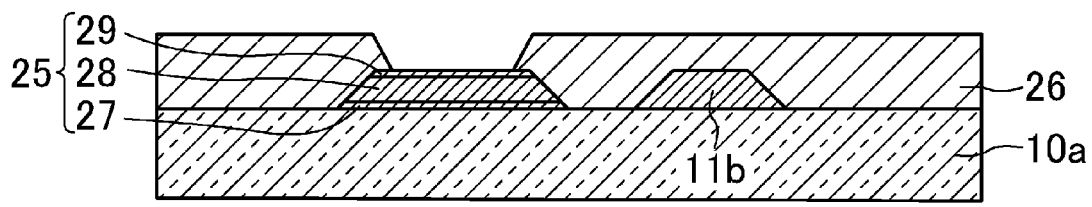
Figure 5C:
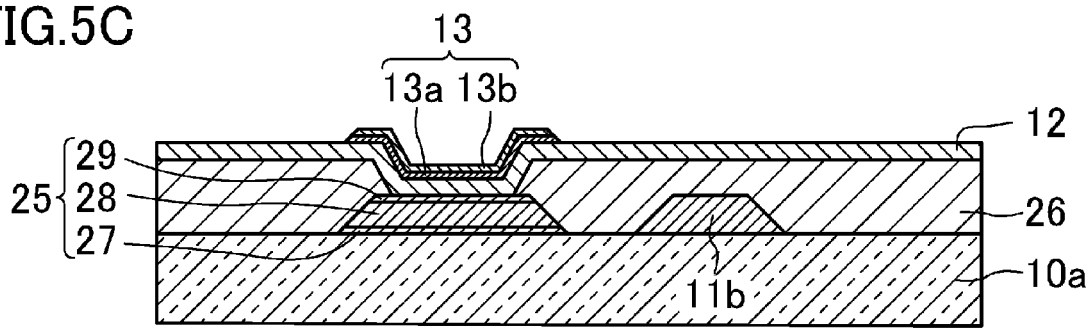
Figure 5D:
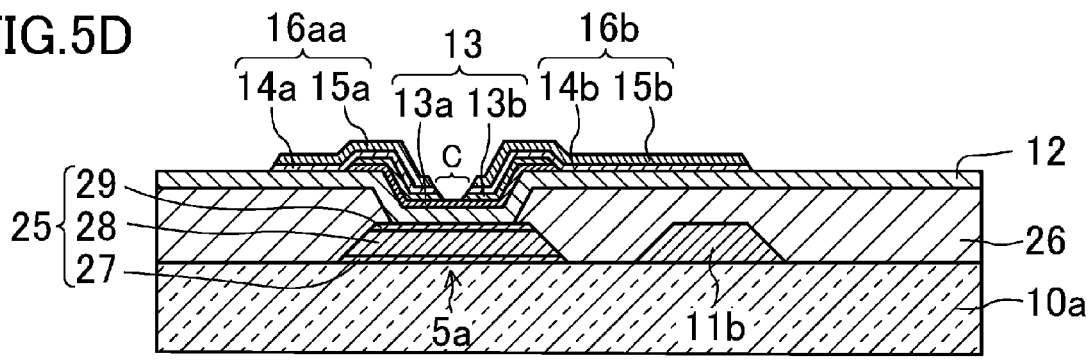
Figure 5E:
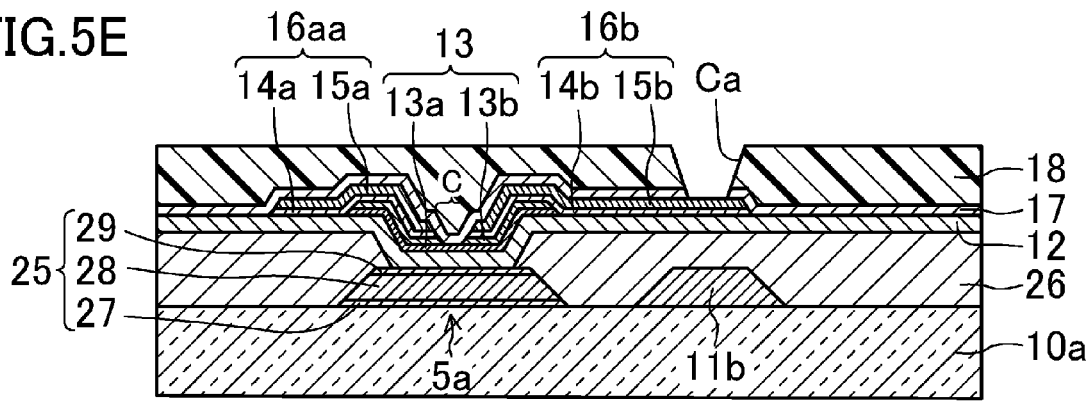

Next, a silicon nitride film, a silicon oxide film, or a silicon nitride oxide film, for example, is deposited by plasma CVD over the entire surface of the substrate on which the source electrodes 16aa and the drain electrodes 16b (i.e., TFTs 5a) have been formed, thereby forming a protection layer 17 covering the TFTs 5a (i.e., covering the semiconductor layer 13, the source electrodes 16aa, and the drain electrodes 16b) and having a thickness of about 100-500 nm as illustrated in FIG. 5(e).

The protection layer 17 is not limited to a single-layer structure, and may have a double-layer structure or a triple-layer structure.

<Interlayer Insulating Film Formation Step>

Subsequently, a photosensitive organic insulating film of, for example, a photosensitive acrylic resin is applied, by spin coating or slit coating, to the entire surface of the substrate on which the protection layer 17 has been formed to a thickness of about 1.0-3.0 µm.

Subsequently, patterning of a resist by photolithography with a fifth photomask having a predetermined pattern, exposure and development of the organic insulating film, removal of the resist, and irrigation are performed, thereby forming, on the surface of the protection layer 17, an interlayer insulating layer 18 having openings corresponding to contact holes Ca as illustrated in FIG. 5(e).

<Contact Hole Formation Step>

Next, dry etching using predetermined etching gases (e.g., a $CF_4$ gas and an $O_2$ gas) is performed using the interlayer insulating layer 18 as a mask to remove portions of the protection layer 17, thereby forming the contact holes Ca in the protection layer 17 and the interlayer insulating layer 18 as illustrated in FIG. 5(e).

<Pixel Electrode Formation Step>

Finally, a transparent conductive film, such as an ITO film (thickness: about 50-200 nm) of indium tin oxide, for example, is deposited by sputtering over the entire surface of the substrate on which the protection layer 17 and the interlayer insulating layer 18 have been formed. Then, patterning of a resist by photolithography with a sixth photomask having a predetermined pattern, exposure and development of the transparent conductive film, removal of the resist, and irrigation are performed, thereby forming pixel electrodes 19a, gate terminals 19b, source terminals 19c, and auxiliary capacitor terminals 19d (see FIG. 3) as illustrated in FIG. 4.

In the case of a transmissive liquid crystal display panel 50, the pixel electrodes 19a may include indium oxide or indium zinc oxide containing tungsten oxide, or include indium oxide or indium tin oxide containing titanium oxide, for example. Instead of indium tin oxide (ITO) described above, indium zinc oxide (IZO) or indium tin oxide containing silicon oxide (ITSO), for example, may be used.

In the case of a reflective liquid crystal display panel 50, a conductive film of titanium, tungsten, nickel, gold, platinum, silver, aluminum, magnesium, calcium, lithium, or an alloy containing at least one of these elements may be used as a reflective metal thin film, and this metal thin film may be used for the pixel electrodes 19a.

As such, in this embodiment, an active matrix substrate 20a can be formed by using the six photomasks.

In the foregoing manner, the active matrix substrate 20a illustrated in FIG. 4 can be formed.

<Counter Substrate Formation Step>

First, for example, a black-colored photosensitive resin is applied, by spin coating or slit coating, to the entire surface of an insulating substrate 10b, such as a glass substrate, and is then exposed to light and developed, thereby forming a black matrix 21 with a thickness of about 1.0 µm, as illustrated in FIG. 6(a).

Next, for example, a red-, green-, or blue-colored photosensitive resin is applied, by spin coating or slit coating, to the entire surface of the substrate on which the black matrix 21 has been formed, and is then exposed to light and developed, thereby forming a colored layer 22 of a selected color (e.g., a red layer) with a thickness of about 2.0 µm, as illustrated in FIG. 6(a). Similar processes are performed for the other two colors, thereby forming colored layers 22 of the other two colors (e.g., a green layer and a blue layer) each with a thickness of about 2.0 µm.

Then, a transparent conductive film, such as an ITO film, for example, is deposited by sputtering over the substrate on which the colored layers 22 have been formed, thereby forming a common electrode 23 with a thickness of about 50-200 nm, as illustrated in FIG. 6(b).

Lastly, a photosensitive resin is applied, by spin coating or slit coating, to the entire surface of the substrate on which the common electrode 23 has been formed, and is then exposed to light and developed, thereby forming photospacers 24 each with a thickness of about 4 µm, as illustrated in FIG. 6(c).

In the foregoing manner, a counter substrate 30 can be formed.

<Liquid Crystal Injection Step>

First, a resin film of polyimide is applied by printing to the surfaces of the active matrix substrate 20a formed by the above-descried active matrix substrate formation step and the counter substrate 30 formed by the above-descried counter substrate formation step, and is then subjected to baking and rubbing, thereby forming an alignment film.

Next, a sealant of, for example, an ultraviolet (UV)/thermosetting resin is printed in a frame shape on the surface of the counter substrate 30 on which the alignment film has been formed, and then a liquid crystal material is dropped inside the sealant.

Furthermore, the counter substrate 30 on which the liquid crystal material has been dropped and the active matrix substrate 20a on which the alignment film has been formed are bonded together under a reduced pressure to form a bonded assembly. This bonded assembly is then exposed to the air under an atmospheric pressure, thereby pressurizing the front and back surfaces of the bonded assembly.

Subsequently, the sealant enclosed in the bonded assembly is irradiated with UV light, and then the bonded assembly is heated, thereby curing the sealant.

Lastly, the bonded assembly enclosing the cured sealant is diced, for example, and unwanted portions thereof are removed.

In the foregoing manner, the liquid crystal display panel 50 of this embodiment can be fabricated.

The foregoing embodiment can obtain the following advantages.

(1) In this embodiment, the planarizing film 26 made of a baked SOG material is formed on the gate electrodes 25, and the gate electrodes 25 are each a multilayer film including the first conductive film 27 made of a metal except copper, the second conductive film 28 formed on the first conductive film 27 and made of copper, and the third conductive film 29 formed on the second conductive film 28 and made of the metal except copper. Therefore, even when an SOG material is applied to the entire surface of a substrate on which gate electrodes have been formed, is then baked at high temperature to form the planarizing film 26, and during this formation, the SOG material undergoes a dehydration polymerization reaction to produce moisture, the moisture can be prevented from causing oxidation of copper forming portions of the gate electrodes 25. Furthermore, copper can be prevented from diffusing from the second conductive film 28 into the SOG material due to the baking. Therefore, an increase in the resistance of the gate electrodes 25 can be reduced, and an increase in the dielectric constant of the SOG material can be reduced, thereby preventing a deterioration in the insulation performance of the planarizing film 26.

(2) In this embodiment, titanium (Ti), molybdenum nitride (MoN), titanium nitride (TiN), tungsten (W), a molybdenum-titanium alloy (MoTi), or a molybdenum-tungsten alloy (MoW) is used as the metal forming the first and third conductive films 27 and 29 except copper. Therefore, the first and third conductive films 27 and 29 can be made of a highly non-diffusive material that can be etched by wet etching at the same time as copper.

Second Embodiment

Figure 7A:
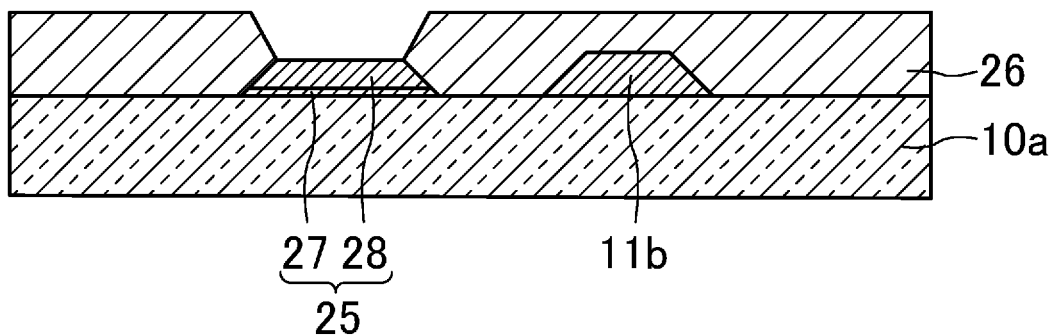
FIGS. 7(a) and 7(b) are cross-sectional views illustrating process steps for manufacturing an active matrix substrate according to a second embodiment of the present disclosure.
Figure 7B:
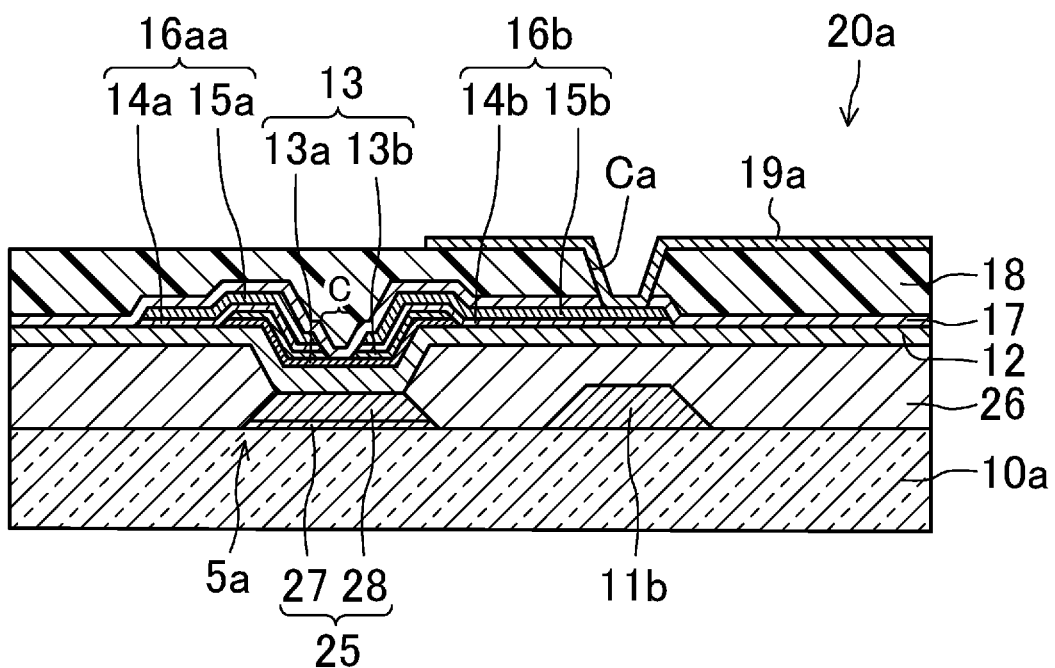

Next, a second embodiment of the present disclosure will be described. FIGS. 7(a) and 7(b) are cross-sectional views illustrating process steps for manufacturing an active matrix substrate according to the second embodiment of the present disclosure.

A feature of this embodiment is that when gate electrodes 25 each of which is a multilayer film including the first through third conductive films 27-29 are formed, and then the planarizing film 26 is formed, the third conductive film 29 is removed.

More specifically, in order to manufacture an active matrix substrate 20a of this embodiment, a gate electrode formation step is first performed in a manner similar to that in FIG. 5(a) illustrated in the above-described first embodiment.

<Planarizing Film Formation Step>

Subsequently, similar to the above-described first embodiment, an SOG material having, e.g., silanol (Si(OH)$_4$) as the main ingredient is applied, by spin coating or slit coating, to the entire surface of the substrate on which the gate electrodes 25 and other components have been formed. Thereafter, the SOG material is baked at 350° C. to form a silicon dioxide (SiO$_2$) layer.

Next, patterning of a resist by photolithography with a second photomask having a predetermined pattern, dry etching of the silicon dioxide layer, removal of the resist, and irrigation are performed to form a planarizing film 26 (thickness: 100-3000 nm) on the gate electrodes 25, as illustrated in FIG. 7(a).

In this case, in this embodiment, as illustrated in FIG. 7(a), dry etching of the third conductive film 29 forming upper layers of the gate electrodes 25 is performed at the same time as dry etching of the silicon dioxide layer forming the planarizing film 26, thereby removing the third conductive film 29.

In the dry etching of the above-described silicon dioxide layer, the third conductive film 29 suffers damage due to etching. The etch rate of the above-described silicon dioxide layer in dry etching of the layer is not uniform across the etching surface of the layer, and thus, when the third conductive film 29 having a relatively high etch rate is to be left, the third conductive film 29 needs to be thicker.

The formation of the thicker film decreases productivity, and increases cost. Furthermore, when the third conductive film 29 forming upper layers of the gate electrodes 25 has a large thickness, this causes poor application of the SOG material.

By contrast, when, similar to this embodiment, dry etching of the third conductive film 29 forming the upper layers of the gate electrodes 25 is performed at the same time as dry etching of the silicon dioxide layer to remove the third conductive film 29, this eliminates the need for leaving the third conductive film 29, thereby eliminating the need for forming the thicker third conductive film 29. This can reduce a reduction in productivity, and can prevent an increase in cost.

Furthermore, since the thicker third conductive film 29 forming the upper layers does not need to be formed, this can prevent a problem of poor application of the SOG material.

Also in this embodiment, when an SOG material is applied and baked, the third conductive film 29 is not removed, and is formed on the second conductive film 28; therefore, similar to the above-described first embodiment, even when the baking causes the SOG material to undergo a dehydration polymerization reaction to produce moisture, the moisture can be prevented from causing oxidation of copper forming portions of the gate electrodes 25. Furthermore, copper can be prevented from diffusing from the second conductive film 28 into the SOG material due to the baking.

Thereafter, in a manner similar to that in FIGS. 5(c)-5(e) illustrated in the above-described first embodiment, a gate insulating layer formation step, a semiconductor layer formation process step, a source/drain formation step, a protection layer formation step, an interlayer insulating layer formation step, a contact hole formation step, and a pixel electrode formation step are performed, thereby forming the active matrix substrate 20a illustrated in FIG. 7(b).

Then, the counter substrate formation step and the liquid crystal injection step both illustrated in the above-described first embodiment are performed, thereby fabricating a liquid crystal display panel 50 of this embodiment.

The foregoing present embodiment can obtain, not only the above-described advantages (1) and (2), but also the following advantages.

(3) In this embodiment, in the planarizing film formation step, the third conductive film 29 is removed. This eliminates the need for leaving the third conductive film 29, thereby eliminating the need for forming the thicker third conductive film 29. This elimination can reduce a reduction in productivity, and can prevent an increase in cost.

(4) Furthermore, since the thicker third conductive film 29 forming the upper layers does not need to be formed, this can prevent a problem of poor application of the SOG material.

Third Embodiment

Next, a third embodiment of the present disclosure will be described. FIGS. 8(a)-8(d) are cross-sectional views illustrating process steps for manufacturing an active matrix substrate according to the third embodiment of the present disclosure.

In the above-described first embodiment, six photomasks are used to form an active matrix substrate 20a. However, a feature of this embodiment is that five photomasks are used to form an active matrix substrate 20a.

More specifically, in order to manufacture the active matrix substrate 20a of this embodiment, a first photomask and a second photomask are used in a manner similar to that in FIGS. 5(a) and 5(b) illustrated in the above-described first embodiment to perform a gate electrode formation step and a planarizing film formation step.

<Gate Insulating Layer/Semiconductor Layer Formation Step>

Figure 8A:
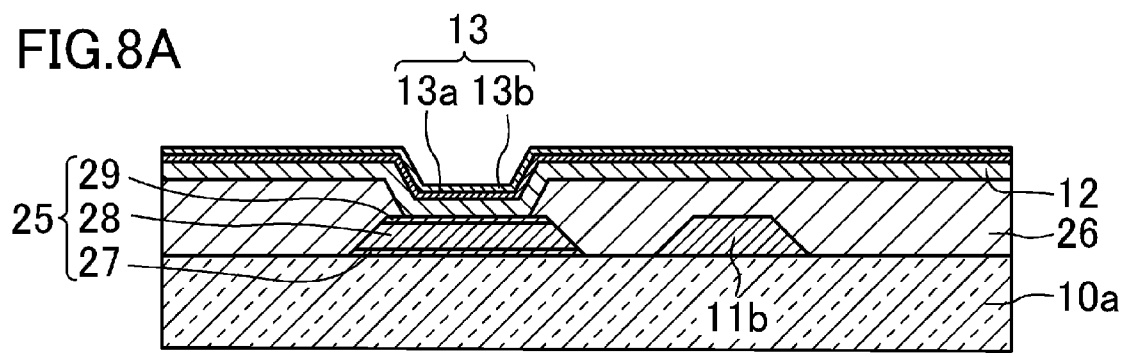
FIGS. 8(a)-8(d) are cross-sectional views illustrating process steps for manufacturing an active matrix substrate according to a third embodiment of the present disclosure.

Subsequently, a silicon nitride film (thickness: about 200-500 nm), for example, is deposited by CVD over the entire surface of a substrate on which a planarizing film 26 has been formed, and as illustrated in FIG. 8(a), a gate insulating layer 12 is formed to cover gate electrodes 25 and auxiliary capacitor lines 11b. Subsequently, an intrinsic amorphous silicon film (thickness: 30-300 nm) and an n$^+$ amorphous silicon film (thickness: 50-150 nm) doped with phosphorus, for example, are successively deposited by plasma CVD over the entire surface of the substrate on which the gate insulating layer 12 has been formed, and as illustrated in FIG. 8(a), an intrinsic amorphous silicon layer 13a and an n$^+$ amorphous silicon layer 13b are stacked to form a semiconductor layer 13.

<Source/Drain Formation Step>

Figure 8B:
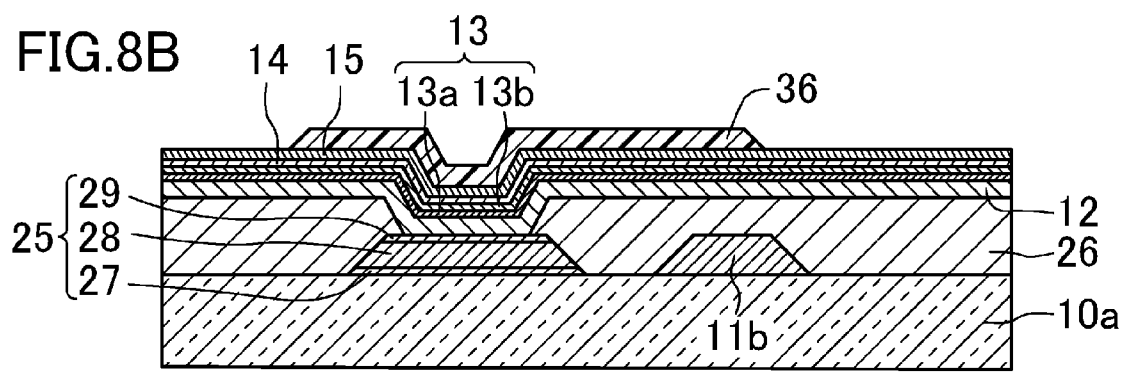
Figure 8C:
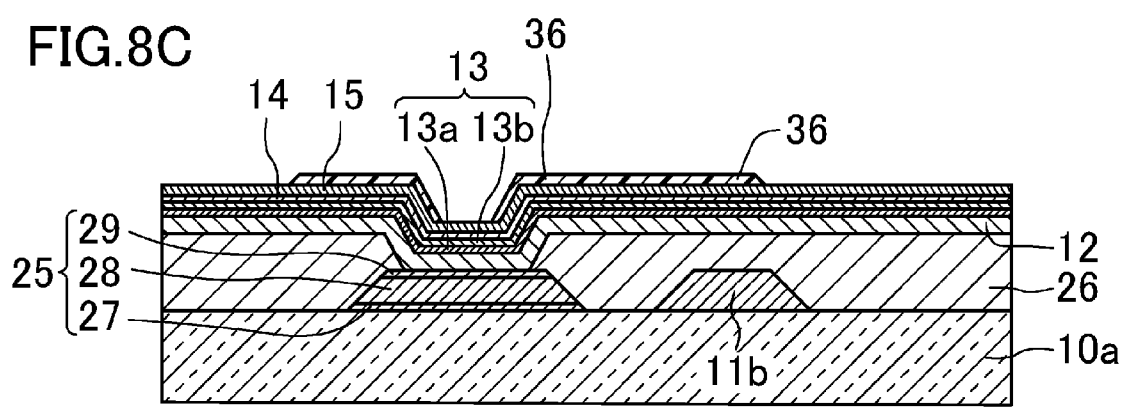
Figure 8D:
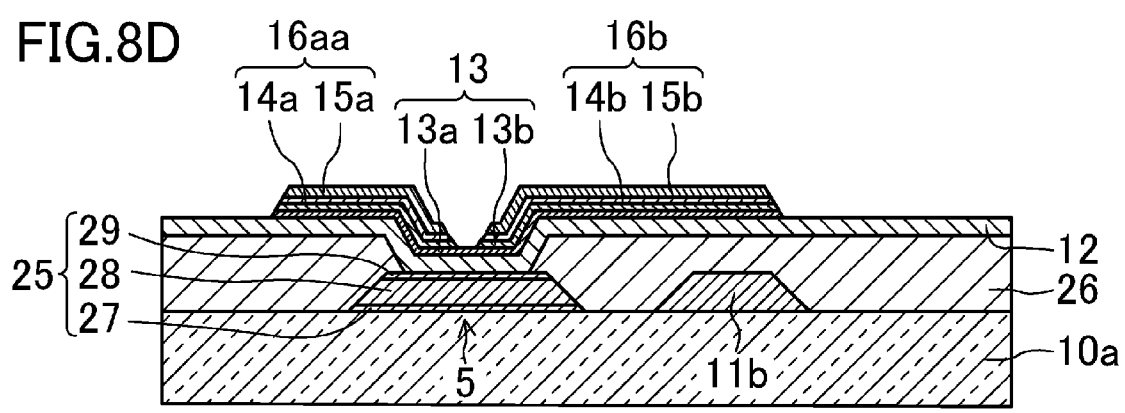

Subsequently, a titanium film 14 (thickness: 5-100 nm) and a copper film 15 (100-500 nm), for example, are sequentially deposited by sputtering over the entire surface of the substrate on which the semiconductor layer 13 has been formed. Subsequently, a photoresist is formed over the entire surface of the substrate on which the titanium film 14 and the copper film 15 have been formed, and the photoresist is patterned into predetermined shapes with a third photomask by using halftone exposure, thereby forming photoresists 36 as illustrated in FIG. 8(b). Subsequently, as illustrated in FIG. 8(c), the photoresists 36 are ashed to remove portions of the photoresists 36 corresponding to channel regions C, wet etching of the copper film 15 is performed using the photoresists 36 as masks, and dry etching (plasma etching) of the titanium film 14 and the n$^+$ amorphous silicon layer 13b, removal of the photoresists 36, and irrigation are performed. As a result, as illustrated in FIG. 8(d), signal lines 16a (see FIG. 3), source electrodes 16aa, drain electrodes 16b, and auxiliary capacitor main lines 16c (see FIG. 3) are formed with the channel regions C of the semiconductor layer 13 being exposed.

Thereafter, in a manner similar to that in FIG. 5(e) illustrated in the above-described first embodiment, a protection layer formation step, an interlayer insulating layer formation step, a contact hole formation step, and a pixel electrode formation step are performed to form the active matrix substrate 20a.

In this case, the fifth and sixth photomasks described in the embodiments are used as fourth and fifth photomasks, and five photomasks in total are used to form a thin film transistor.

The above-described present embodiment can obtain, not only the above-described advantages (1) and (2), but also the following advantage.

(5) In this embodiment, the following steps are performed: a step of using the first and second photomasks to form the gate electrodes 25 and the planarizing film 26; a step of using the third photomask to form the source electrodes 16aa and the drain electrodes 16b; a step of using the fourth photomask to form the interlayer insulating layer 18; and a step of using the fifth photomask to form the pixel electrodes 19a. Therefore, since the active matrix substrate 20a can be manufactured using (five) masks that are fewer in number than those in the first embodiment, the manufacturing cost can be reduced, and a reduction in yield can be effectively reduced.

The embodiments may be modified as follows.

In the embodiments, the interlayer insulating layer 18 is formed on the protection layer 17. Alternatively, similar to an active matrix substrate 20a illustrated in FIG. 9, the pixel electrodes 19a may be formed on the protection layer 17 without forming the interlayer insulating layer 18 to simplify the manufacturing process.

In this case, the above-described gate electrode formation step, planarizing film formation step, gate insulating layer formation step, semiconductor layer formation step, and source/drain formation step illustrated in FIGS. 5(a)-5(e) are first performed. Thereafter, in the protection layer formation step, a silicon oxide film, a silicon nitride film, or a silicon nitride oxide film, for example, is deposited by plasma CVD on the entire surface of the substrate on which the source electrodes 16aa and the drain electrodes 16b (i.e., TFTs 5a) have been formed, thereby forming a protection layer 17 covering the semiconductor layer 13, the source electrodes 16aa, and the drain electrodes 16b as illustrated in FIG. 10.

Figure 10:
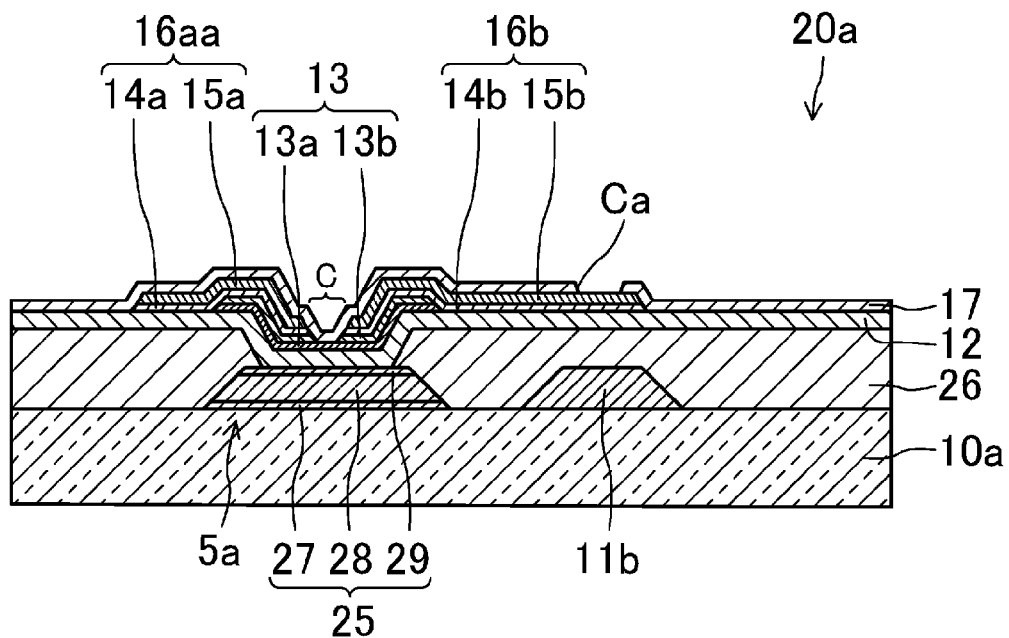
FIG. 10 is a cross-sectional view illustrating a process step for manufacturing an active matrix substrate according to the variation of the present disclosure.

Subsequently, in the contact hole formation step, patterning of a resist by photolithography with the above-described fifth photomask, dry etching of the protection layer 17, removal of the resist, and irrigation are performed to form contact holes Ca reaching the drain electrodes 16b in the protection layer 17 as illustrated in FIG. 10.

Figure 9:
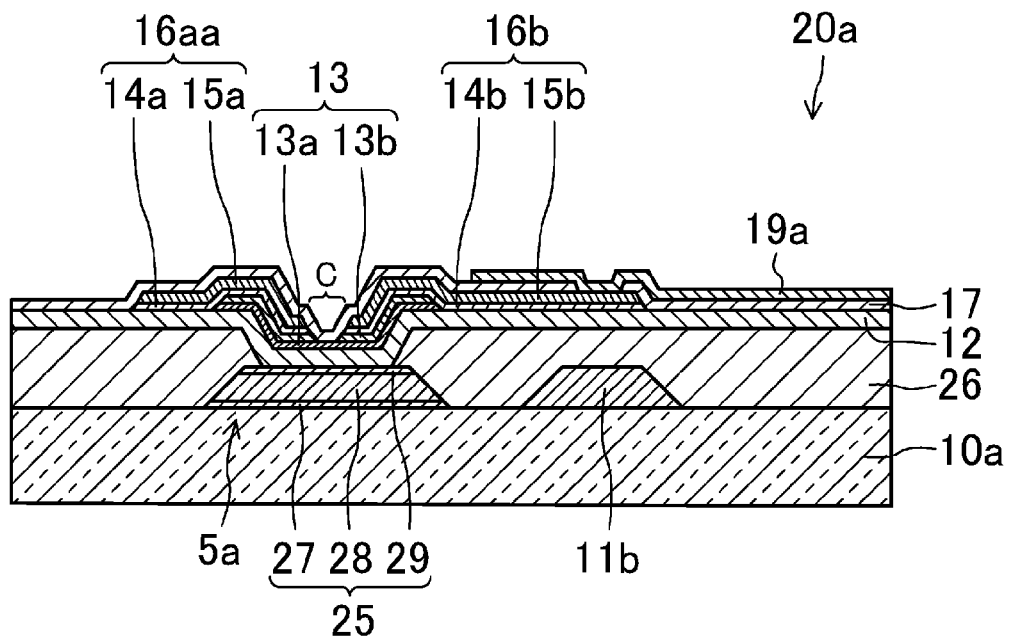
FIG. 9 is a cross-sectional view of an active matrix substrate according to a variation of the present disclosure.

Subsequently, in the pixel electrode formation step, a transparent conductive film, such as an ITO film (thickness: about 50-200 nm) of indium tin oxide, for example, is deposited by sputtering on the protection layer 17. Then, patterning of a resist by photolithography with the above-described sixth photomask, wet etching of the transparent conductive film, removal of the resist, and irrigation are performed, thereby forming pixel electrodes 19a as illustrated in FIG. 9. Such a configuration can also obtain advantages similar to the above-described advantages (1) and (2).

Furthermore, in the embodiments, a silicon semiconductor layer is used as the semiconductor layer, and the semiconductor layer is not limited to the silicon semiconductor layer. Instead of the silicon semiconductor layer, an oxide semiconductor layer made of indium gallium zinc oxide (IGZO), for example, may be used as the semiconductor layer of the TFTs 5a.

Figure 11A:
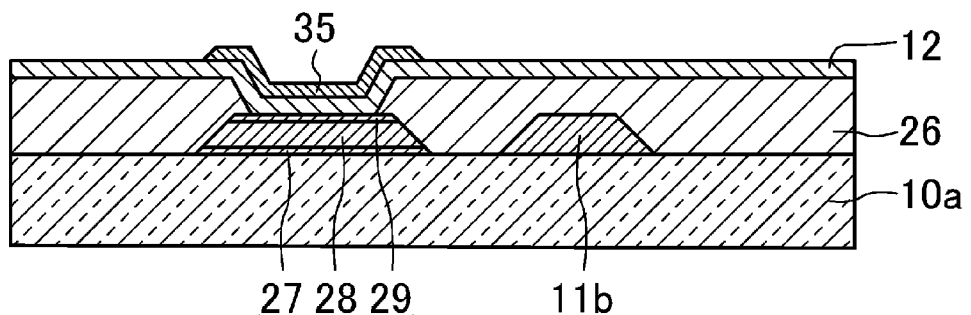
FIGS. 11(a) and 11(b) are cross-sectional views illustrating process steps for manufacturing an active matrix substrate according to another variation of the present disclosure.

In this case, the above-described gate electrode formation step, planarizing film formation step, gate insulating layer formation step illustrated in FIG. 5(a)-5(c) are performed. Thereafter, in the semiconductor layer formation step, an IGZO oxide semiconductor film (thickness: about 30-300 nm), for example, is deposited by plasma CVD over the entire surface of the substrate on which the gate insulating layer 12 has been formed. Thereafter, patterning of a resist by photolithography with the above-described third photomask, dry etching of the IGZO oxide semiconductor film, removal of the resist, and irrigation are performed, thereby patterning the IGZO oxide semiconductor film into an oxide semiconductor layer 35 as illustrated in FIG. 11(a).

Figure 11B:
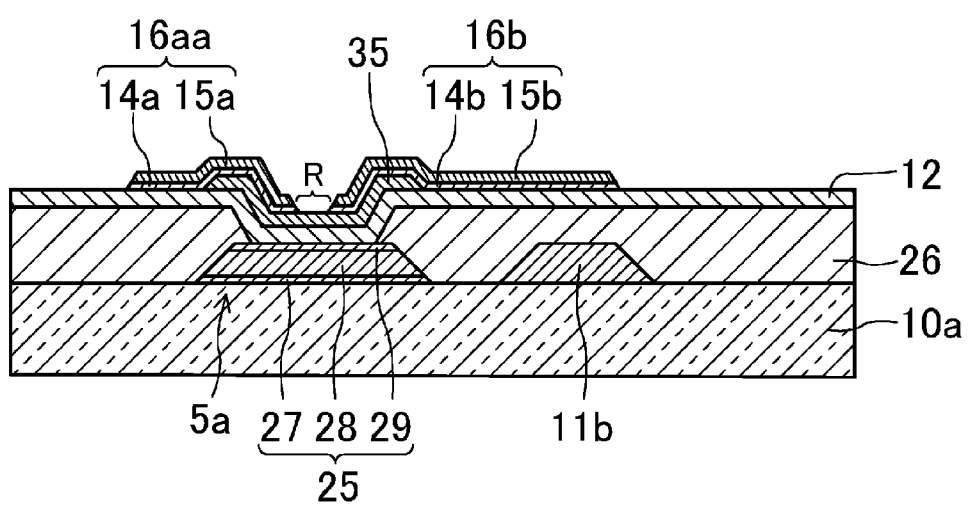

Subsequently, in the source/drain formation step, a titanium film (thickness: 30-100 nm), a copper film (thickness: 100-400 nm), and other films, for example, are sequentially deposited by sputtering over the entire surface of the substrate on which the oxide semiconductor layer 35 has been formed. Thereafter, patterning of a resist by photolithography with the above-described fourth photomask, and wet etching of the copper film are performed, and dry etching (plasma etching) of the titanium film, removal of the resist, and irrigation are performed. As a result, as illustrated in FIG. 11(b), signal lines 16a (see FIG. 3), source electrodes 16aa, drain electrodes 16b, and auxiliary capacitor main lines 16c (see FIG. 3) are formed with channel regions R of the oxide semiconductor layer 35 being exposed.

Figure 12:
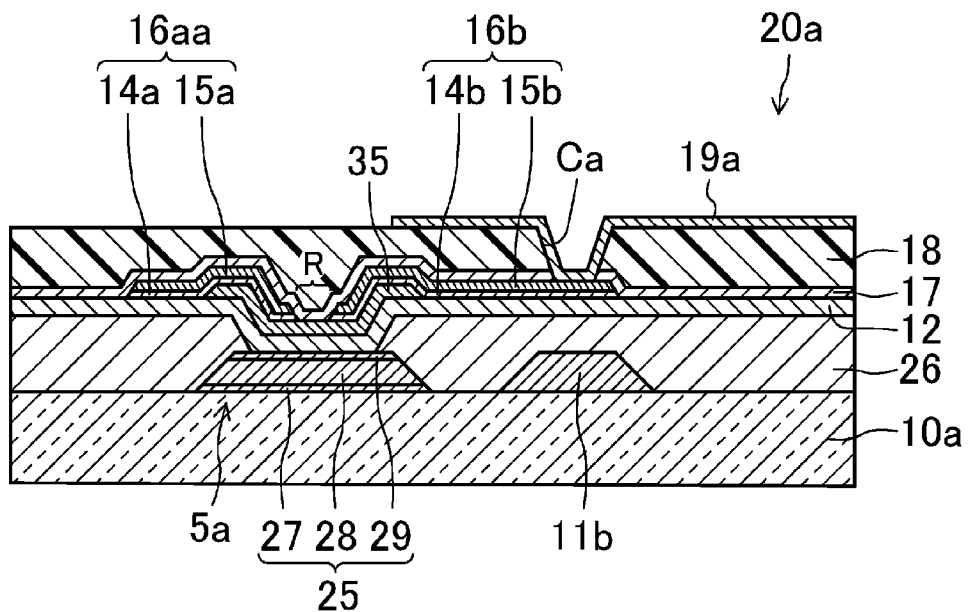
FIG. 12 is a cross-sectional view of an active matrix substrate according to another variation of the present disclosure.

Thereafter, in a manner similar to that in FIG. 5(e) illustrated in the above-described first embodiment, the protection layer formation step, the interlayer insulating layer formation step, the contact hole formation step, and the pixel electrode formation step are performed, thereby forming an active matrix substrate 20a illustrated in FIG. 12. Such a configuration can also obtain advantages similar to the above-described advantages (1) and (2).

An IGZO (In—Ga—Zn—O) oxide semiconductor has been illustrated as an oxide semiconductor forming the oxide semiconductor layer 35. Alternatively, the oxide semiconductor may be an oxide semiconductor of, e.g., In—Si—Zn—O, In—Al—Zn—O, Sn—Si—Zn—O, Sn—Si—Zn—O, Sn—Al—Zn—O, Sn—Ga—Zn—O, Ga—Si—Zn—O, Ga—Al—Zn—O, In—Cu—Zn—O, Sn—Cu—Zn—O, Zn—O, or In—O.

Specifically, the oxide semiconductor layer 35 is not limited to the oxide semiconductor layer made of indium gallium zinc oxide (IGZO), and may be made of a metal oxide material containing at least one of indium (In), gallium (Ga), aluminum (Al), copper (Cu), zinc (Zn), magnesium (Mg), or cadmium (Cd).

The oxide semiconductor layer 35 made of the material can have a high mobility even if the oxide semiconductor layer 35 is amorphous, and therefore, can provide a large on-resistance of the switching element. Therefore, the difference in output voltage during data read operation increases, resulting in an improvement in the S/N ratio. Examples of the oxide semiconductor layer 35 may include an oxide semiconductor film of, e.g., $InGaO_3(ZnO)_5$, $Mg_xZn_{1-x}O$, $Cd_xZn_{1-x}O$, or CdO, in addition to IGZO (In—Ga—Zn—O).

In the first embodiment, an aluminum alloy (an alloy obtained by adding nickel and copper to aluminum) may be used as the metal forming the first and third conductive films 27 and 29.

In the embodiments, a non-photosensitive SOG material has been illustrated as the SOG material. Alternatively, the SOG material may be photosensitive.

In the embodiments, the active matrix substrate 20a using electrodes of the TFTs 5a connected to the pixel electrodes 19a as the drain electrodes 16b has been illustrated. Alternatively, the present disclosure can be applied also to an active matrix substrate using electrodes of TFTs connected to pixel electrodes as source electrodes.

In the embodiments, the liquid crystal display panel including the active matrix substrate has been illustrated as the display panel. Alternatively, the present disclosure can be applied also to other display panels, such as organic electro luminescence (EL) display panels, inorganic EL display panels, and electrophoresis display panels.

INDUSTRIAL APPLICABILITY

As described above, the present disclosure relates to active matrix substrates, methods for manufacturing the same, and display panels, and is useful particularly for an active matrix substrate using a planarizing film, and a method for manufacturing the same.

DESCRIPTION OF REFERENCE CHARACTERS

5a TFT
10a INSULATING SUBSTRATE
11a SCAN LINE
12 GATE INSULATING LAYER
13 SEMICONDUCTOR LAYER
13a INTRINSIC AMORPHOUS SILICON LAYER
13b AMORPHOUS SILICON LAYER
16a SIGNAL LINE
16aa SOURCE ELECTRODE
16b DRAIN ELECTRODE
17 PROTECTION LAYER
18 INTERLAYER INSULATING LAYER
19a PIXEL ELECTRODE
20a ACTIVE MATRIX SUBSTRATE
25 GATE ELECTRODE
26 PLANARIZING FILM
27 FIRST CONDUCTIVE FILM
28 SECOND CONDUCTIVE FILM
29 THIRD CONDUCTIVE FILM
30 COUNTER SUBSTRATE
35 OXIDE SEMICONDUCTOR LAYER
36 PHOTORESIST
37 SEALANT
40 LIQUID CRYSTAL LAYER (DISPLAY MEDIUM LAYER)
50 LIQUID CRYSTAL DISPLAY PANEL (DISPLAY PANEL)

The invention claimed is:

1. An active matrix substrate, comprising:
an insulating substrate;
a gate electrode formed on the insulating substrate;
a planarizing film formed on the gate electrode, and made of a baked SOG material;
a gate insulating layer covering the gate electrode and the planarizing film;
a semiconductor layer formed on the gate insulating layer, and having a channel region overlapping the gate electrode;
source and drain electrodes formed on the semiconductor layer to overlap the gate electrode and face each other with the channel region sandwiched therebetween;
a protection layer covering the semiconductor layer, the source and drain electrodes; and
a pixel electrode formed on the protection layer, wherein
the gate electrode is a multilayer film including a first conductive film formed on the insulating substrate and made of a metal except copper, a second conductive film formed on the first conductive film and made of copper, and a third conductive film formed on the second conductive film and made of the metal except copper; and
an interlayer insulating layer is formed on the protection layer, and the pixel electrode is formed on the interlayer insulating layer.

2. The active matrix substrate of claim 1, wherein
the metal except copper is at least one selected from a group consisting of titanium (Ti), molybdenum nitride (MoN), titanium nitride (TiN), tungsten (W), a molybdenum-titanium alloy (MoTi), and a molybdenum-tungsten alloy (MoW).

3. The active matrix substrate of claim 1, wherein
the semiconductor layer is an oxide semiconductor layer.

4. The active matrix substrate of claim 3, wherein the oxide semiconductor layer is made of a metal oxide containing at least one selected from a group consisting of indium (In), gallium (Ga), aluminum (Al), copper (Cu), and zinc (Zn).

5. The active matrix substrate of claim 4, wherein the oxide semiconductor layer is made of indium gallium zinc oxide (IGZO).

6. The active matrix substrate of claim 1, wherein the semiconductor layer is a silicon semiconductor layer.

7. A display panel, comprising:
an active matrix substrate, including:
    an insulating substrate;
    a gate electrode formed on the insulating substrate;
    a planarizing film formed on the gate electrode, and made of a baked SOG material;
    a gate insulating layer covering the gate electrode and the planarizing film;
    a semiconductor layer formed on the gate insulating layer, and having a channel region overlapping the gate electrode;
    source and drain electrodes formed on the semiconductor layer to overlap the gate electrode and face each other with the channel region sandwiched therebetween;
    a protection layer covering the semiconductor layer, the source and drain electrodes; and
    a pixel electrode formed on the protection layer;
a counter substrate placed so as to be opposed to the active matrix substrate; and
a display medium layer formed between the active matrix substrate and the counter substrate, wherein
the gate electrode is a multilayer film including a first conductive film formed on the insulating substrate and made of a metal except copper, a second conductive film formed on the first conductive film and made of copper, and a third conductive film formed on the second conductive film and made of the metal except copper.

8. The display panel of claim 7, wherein the metal except copper is at least one selected from a group consisting of titanium (Ti), molybdenum nitride (MoN), titanium nitride (TiN), tungsten (W), a molybdenum-titanium alloy (MoTi), and a molybdenum-tungsten alloy (MoW).

9. The display panel of claim 7, wherein the semiconductor layer is an oxide semiconductor layer.

10. The display panel of claim 9, wherein the oxide semiconductor layer is made of a metal oxide containing at least one selected from a group consisting of indium (In), gallium (Ga), aluminum (Al), copper (Cu), and zinc (Zn).

11. The display panel of claim 10, wherein the oxide semiconductor layer is made of indium gallium zinc oxide (IGZO).

12. The display panel of claim 7, wherein the semiconductor layer is a silicon semiconductor layer.

* * * * *